United States Patent [19]

Patel et al.

[11] Patent Number: 4,745,604

[45] Date of Patent: May 17, 1988

[54] METHOD AND APPARATUS FOR TRANSFERRING DATA BETWEEN A HOST PROCESSOR AND A DATA STORAGE DEVICE

[75] Inventors: Arvind M. Patel; David T. Wang; Wellington C. Yu, all of San Jose, Calif.

[73] Assignee: International Business Machines Corporation, Armonk, N.Y.

[21] Appl. No.: 921,022

[22] Filed: Oct. 20, 1986

[51] Int. Cl.$^4$ ............................................. G06F 11/10
[52] U.S. Cl. ....................................... 371/38; 364/200
[58] Field of Search ...................... 371/37, 38, 39, 40; 364/200, 900

[56] References Cited

U.S. PATENT DOCUMENTS

| | | | |
|---|---|---|---|
| 3,883,847 | 5/1975 | Frank | 364/900 |
| 4,013,997 | 3/1977 | Treadwell, III | 371/38 |
| 4,371,949 | 2/1983 | Chu et al. | 364/900 |
| 4,525,838 | 6/1985 | Patel | 371/37 |
| 4,688,225 | 8/1987 | Fukami et al. | 371/37 |
| 4,706,250 | 11/1987 | Patel | 371/39 |

OTHER PUBLICATIONS

H. K. Chang et al., "Cyclic Memory Record Format Without Intrarecord Gaps", IBM Technical Disclosure Bulletin, vol. 19, No. 10, (Mar. 1977), pp. 3890-3891.
P. T. Burton, "Method for Enhancement of Correctability of Recording Data Errors in Computer Direct-Access Storage Devices", IBM Technical Disclosure Bulletin, vol. 24, No. 11B, (Apr. 1982), pp. 6213-6214.
J. S. Conzola et al., "Error Correction Without Speed Degradation", IBM Technical Disclosure Bulletin, vol. 10, No. 8, (Jan. 1968), p. 1275.

Primary Examiner—Charles E. Atkinson
Attorney, Agent, or Firm—Thomas R. Berthold

[57] ABSTRACT

In a data processing system in which two-level error correction is performed on variable length data being transferred between the host processor and the data storage device, the logical length of the data being transferred is computed during a fixed time gap with computation continuing after termination of the fixed time gap and commencement of the data transfer. The computation required for the logical length of the data field to accommodate two-level ECC is accomplished by first comparing the actual field length with a value predetermined by the subblock length of the two-level ECC. If the actual length is greater than the predetermined value, then a value equal to the subblock length plus first level ECC bytes is loaded into a counter which begins decrementing at the termination of the fixed time gap so as to synhronize by the byte-by-byte transfer of the data. As the data is being transferred the computation continues. When the computation has been completed, a value equal to the difference between the computed logical length and the subblock length plus first level ECC bytes is loaded into other counters which begin decrementing when the first counter reaches zero. In this manner transfer of the data is not interrupted. This permits two-level ECC to be incorporated into prior data processing systems which utilize a conventional track format with predetermined fixed time gaps, even though such fixed time gaps would otherwise be of insufficient duration to permit computation of the logical length required for two-level ECC.

11 Claims, 3 Drawing Sheets

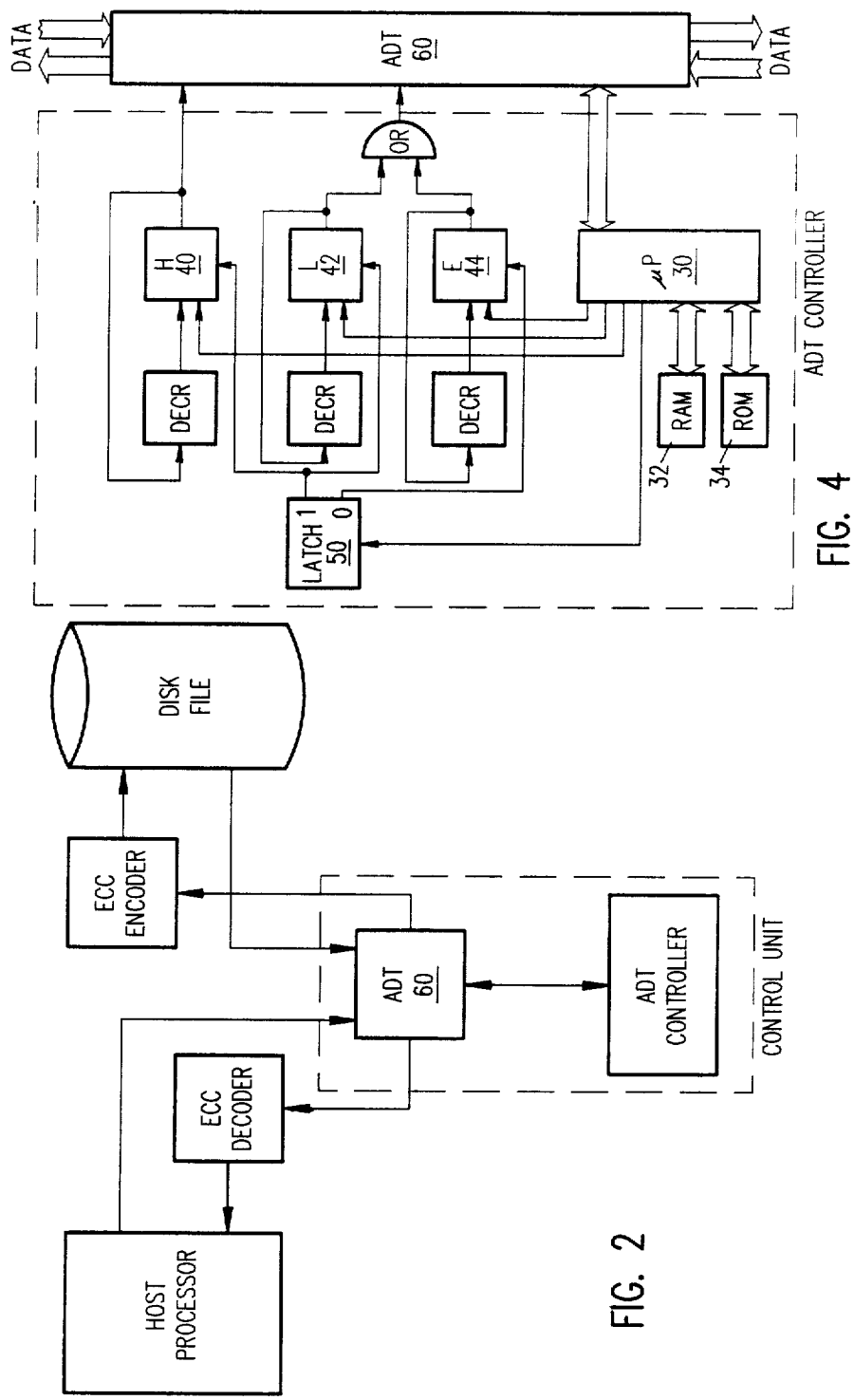

METHOD AND APPARATUS FOR TRANSFERRING DATA BETWEEN A HOST PROCESSOR AND A DATA STORAGE DEVICE

TECHNICAL FIELD

This invention relates to methods and apparatus for transferring variable length data between a host computer and a data storage device, such as a magnetic recording disk file. More specifically, the invention relates to an improved method and apparatus for performing calculations during the fixed time gaps between data fields, the calculations being necessary in order to perform such tasks as error correction encoding and decoding, splitting the fields across defects in the data tracks of the disk file, and padding of the fields to assure that the fields terminate at the end of discrete multiple-byte cells.

BACKGROUND OF THE INVENTION

When data is written from a host computer to a magnetic recording disk file, or read from the disk file back to the host computer, the data is transferred in a specific format comprising variable length records separated by fixed time gaps between the records. Each record typically includes several fields, some of which may be of fixed length, which are also separated by fixed time gaps. The transfer of data is controlled by a control unit which includes automatic data transfer (ADT) circuitry.

Before the data is written onto the tracks of the disk file it is often desirable to encode the data with error correction bytes. Thus when the data is subsequently read from the tracks, the error correction bytes can be decoded and errors in the data corrected before transfer back to the host processor. The error correction code (ECC) requires that the variable length field be lengthened by the number of ECC bytes required. A description of an error correcting system is given in U.S. Pat. No. 4,185,269, which is assigned to the same assignee as this application.

Additional bytes must also be appended at the end of the field to "pad" the field so that its total length equals a discrete number of multiple-byte cells.

In addition, if data is to be recorded onto a track which contains a defect in the magnetic recording media, then it is necessary to calculate the amount of data between the beginning of the field and the occurrence of the defect. This calculation requires the use of information obtained from a specific field in the record which identifies the track number and physical location on the track where the data is recorded. From this information the location and length of the defect is determined and used to split the field into segments across the defect. In this manner the defect is skipped.

The computation of the logical length of the field, i.e. the calculation of the number of ECC bytes and padding bytes as well as the calculation of defect skipping, occurs in the fixed time gap immediately preceding the field to be transferred.

In order to maximize the data transfer rate and the track capacity, it is desirable to minimize the fixed time gaps between fields or at least to maintain the fixed time gaps the same length so that newer disk files can utilize the same track format as prior disk files. However, improvements in error correction techniques, which result in a more complex two-level ECC, require more complex calculations in the fixed time gaps. An error correcting system which utilizes a two-level ECC is described in U.S. Pat. No. 4,525,838, which is assigned to the same assignee as this application. Thus, while in the use of prior single-level ECC it was necessary to merely add a fixed number of ECC bytes at the end of each field, the use of two-level ECC requires that a computation be preformed to determine the number of subblocks of data within each field. Thereafter the ECC encoder appends ECC bytes at the end of each subblock to provide a first level of error correction, and additional ECC bytes at the end of the complete field to provide the second level of error correction. These additional computations require more time than that required for single-level ECC. Thus a technique must be found to prevent increasing the fixed time gap between the fields, so that two-level ECC can be incorporated into prior data recording systems which utilize a preexisting fixed data track format with fixed time gaps between the fields.

SUMMARY OF THE INVENTION

The present invention is a method and apparatus for computing the logical length of a field during the transfer of data between a host processor and a disk file which allows a two-level ECC to be implemented without increasing the fixed time gaps between fields.

In the method for determining the logical length of the field, a microprocessor in the control unit fetches from storage in the ADT the actual length of the data field, as well as the track number and record number within the track where the data is to be written to or read from. The actual length of the field is then compared to a value predetermined by the length of the preset subblock length for the two-level ECC. If the field is less than this predetermined value, the microprocessor adds the fixed number of ECC bytes to the field length, computes the number of bytes needed for cell padding and loads this total logical length value into two counters, a high counter for most significant bits and a low counter for lesser significant bits. At the end of the fixed time gap the ADT commences transferring the data simultaneously with the decrementing of the two counters such that when the counters have decremented to zero the data transfer has been completed.

If, on the other hand, the actual field length is greater than the predetermined value from a single subblock, then the calculation must be performed to determine the number of subblocks required. The microprocessor then loads a third "early" counter with a value equal to the subblock length plus the ECC byte length. The microprocessor then begins the computation of the number of subblocks, the number of bytes to be placed on either side of a defect if a defect splits the field, and the number of bytes to pad the field to an integral number of cells. When the fixed time gap has elapsed the ADT commences transferring data simultaneously with the decrementing of the early counter, even though the computation of the logical length may still be continuing. When the computation has been completed, which is before the early counter has decremented to zero, the microprocessor loads the low and high counters with a value equal to the difference between the computed total logical length and the value of subblock length plus ECC bytes previously loaded into the early counter. When the early counter has decremented to zero, the low and high counters begin decrementing and the ADT continues the transfer of data without interruption. The transfer continues until the low and high counters have decremented to zero, at which time the transfer of the field is completed.

For a fuller understanding of the nature and advantages of the present invention, reference should be made to the following detailed description taken in conjunction with the accompanying drawings.

BRIEF DESCRIPTION OF THE DRAWINGS

FIG. 2 is a generalized block diagram showing the host processor, the disk file, the ADT for automatic data transfer, and the ADT controller for computing the logical length of each data field and initiating operation of the ADT;

FIG. 4 is a simplified block diagram of the ADT controller with counters for initiating operation of the ADT.

DESCRIPTION OF THE PREFERRED EMBODIMENTS

Figure 1:
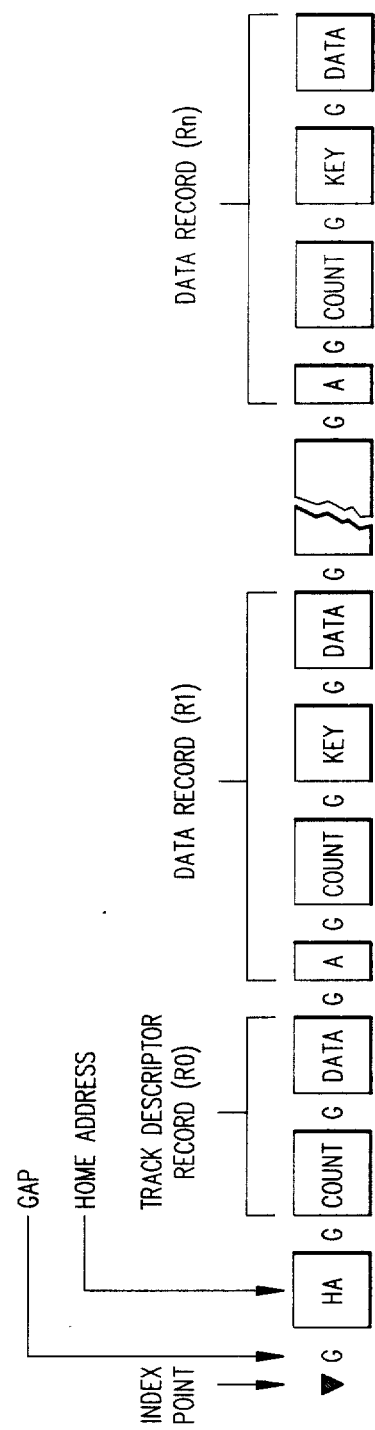
FIG. 1 is a representation of a data track in conventional count-key-data (CKD) format.

A typical conventional track format for a data recording disk file is shown in FIG. 1. The index point, which is a signal received from an external source such as an encoded pattern on a dedicated servo disk, indicates the physical beginning of the track. On each track there is a home address (HA) which defines the physical radial location of the track on the disk. Following the home address is the track descriptor record (R0) which contains information about the condition of the track, including the location and length of any defects on the track.

Following record R0 are the data records R1 to Rn, which for purposes of illustration are in conventional count-key-data (CKD) format. The count field in each data record is of fixed length and includes bytes which indicate the length of the following key and data fields. The key and data fields which follow the count fields are of variable length, depending upon the information recorded by the user. Physical gaps, represented as "G" in FIG. 1, separate the recorded areas on the track. There are gaps between adjacent records and gaps between fields within a record. The length of a gap varies with the particular track format and the location of the gap. However, each gap between variable length fields is the same within each record. The gaps are required between the fields to perform certain hardware functions, including the encoding and decoding of the data, and the padding of the variable length fields, as further described below.

The simplified block diagram of FIG. 2 depicts the manner in which the data from the host processor is encoded with ECC by the ECC encoder before it is written onto the tracks of the disk file, and the manner in which the encoded data read from the tracks is decoded before transfer back to the host processor. The control of the transfer of data between the host processor and the disk file is coordinated by the automatic data transfer circuitry (ADT) of the control unit. The ADT essentially receives each variable length field from the host processor and, in response to the ADT controller, increases its logical length to provide room for the ECC bytes before the field is written onto the data track. Similarly, when the encoded field is read from the disk file the ADT must convert the variable length field to its proper actual length without ECC bytes, while assuring that all error corrections have been made. In addition, the ADT must skip defects on the data track and thus coordinate the splitting of the field into segments on both sides of the defect. Because the field written on the track, which includes ECC bytes, must equal a discrete number of "cells", the ADT must also pad the variable length field with bytes at the end to provide a total field length equal to a discrete number of cells.

Figure 3A:
FIGS. 3A, 3B and 3C illustrate respectively a typical field, a field written onto a track with single-level ECC, and a field written onto a track with two-level ECC.
Figure 3B:
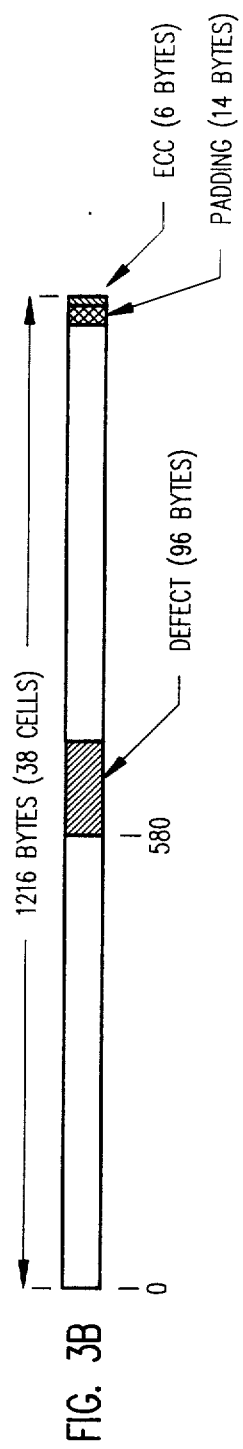

Referring now to FIG. 3A, a typical field is depicted, for purposes of illustration, as having an actual length of 1100 bytes. The field of FIG. 3A may be any key or data field from any of the data records shown in FIG. 1, but will be described herein as a data field. FIG. 3B depicts the conventional manner in which this 1100 byte field is written with single-level ECC on a data track containing a 96 byte (3 cell) long defect at a location corresponding to 580 bytes from the beginning of the field. The actual length of the field, 1100 bytes, the track number and the location on the track where the field is to be written are all obtained from the count field which precedes the data field in the CKD data record. The length of the defect and its location at 580 bytes from the beginning of the data field is obtained by the control unit from a look-up table for the particular track, based upon the known track number and location on the track where the field is to be written. Thus, before the field can be transferred to the disk file, provision must be made in its length to accommodate the additional 96 bytes for the defect. In addition, in conventional data transfer techniques which utilize single-level error correction, a fixed number of ECC bytes must be appended, as shown in FIG. 3B. In the example shown in FIG. 3B, six additional ECC bytes are required. Also, because the data must be recorded in a discrete number of cells, each cell being for example 32 bytes, the data field must be "padded" to fill out the next discrete cell. Thus, as shown by a comparison of FIGS. 3A and 3B, the data transferred from the host processor in the form of 1100 actual bytes is transferred as a field with a logical length of 1216 bytes. The additional bytes include 96 bytes to accommodate the track defect, 6 bytes for the single-level ECC, and 14 bytes to pad the field out to 38 discrete cells. Typically the padding bytes follow the last data byte in the field with the ECC bytes appended after the padding bytes, as shown in FIG. 3B.

The computation of the logical length of the field in the manner just described occurs in the fixed time gap immediately preceding the field to be transferred. Thus when it is time to transfer the field at the end of the fixed time gap, the correct logical length has already been determined and the transfer of 1216 bytes to the disk file can occur. Similarly, when the data is to be read from the disk file for transfer back to the host processor, the same computations occur in order to assure that the correct 1100 actual bytes are transferred to the host processor.

Figure 3C:
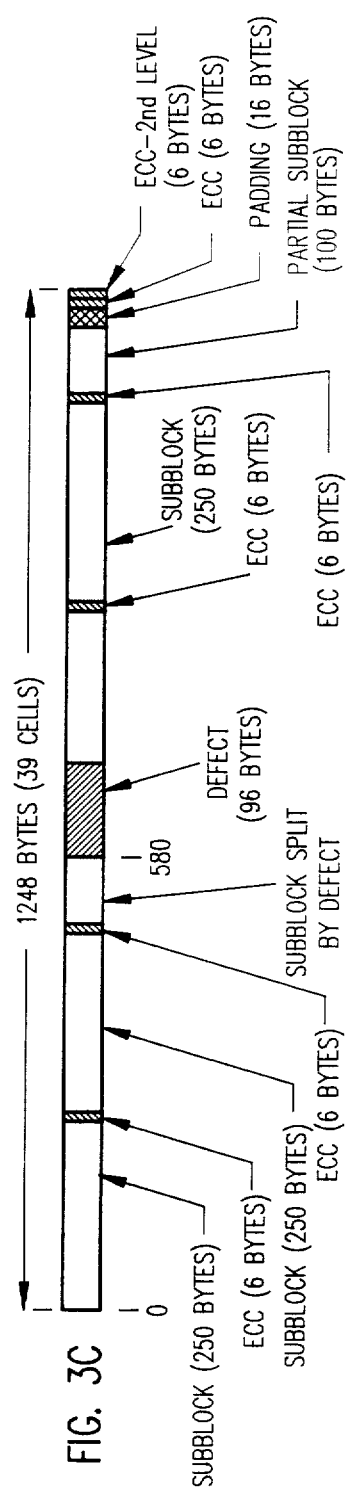

Referring now to FIG. 3C, the same 1100 byte data field of FIG. 3A is represented as written onto a data track with two-level ECC. In the two-level ECC, the 1100 bytes are divided into a number of subblocks of fixed length and a remaining partial subblock. In the example shown in FIG. 3C, each subblock has a fixed length of 250 bytes with a first level of 6 ECC bytes at the end of each subblock. The second level of ECC occurs with a fixed number of bytes, in this example 6, at the end of the data field and following the padding bytes. Thus, for the 1100 byte example, 36 ECC bytes are required. The additional ECC bytes required for the two-level ECC also results in a different number of padding bytes. Thus in the example of FIG. 3C, the 1100 byte field is required to have a total logical length of 1248 bytes in order to be written with two-level ECC and padded out to 39 cells.

As is apparent, the use of the two-level ECC greatly increases the complexity of the calculations required to be performed during the fixed time gap. First a determination has to be made as to how many subblocks are contained in the data field. Then the particular subblock and the location within that subblock at which the defect occurs must be identified.

Thus, if it is desired to use the same track format with the same fixed time gaps between the fields as in conventional disk files which utilize single-level ECC, some provision must be made for assuring that the computations required to result in the track of FIG. 3C can be performed within the fixed time gaps. The manner in which these computations can occur without substantial change to the existing hardware in the control unit and without increasing the fixed time gaps will be now explained with reference to FIG. 4.

The ADT controller includes a microprocessor 30 which is connected by suitable address and bus lines to storage devices such as RAM 32 and ROM 34. Microprocessor 30 provides an output to three counters, a high counter 40, a low counter 42 and an "early" counter 44. Each of the counters 40, 42, 44 is connected to associated circuitry for decrementing the counters from whatever values are stored in the counters. Microprocessor 30 also provides an output to low counter 42 and early counter 44 through an "early mode" latch 50.

The ADT 60 is controlled by microprocessor 30 and counters 40, 42, 44. The microprocessor 30 signals the ADT 60 at the termination of the fixed time gap to commence data transfer. Data transfer then occurs byte-by-byte in coordination with the decrementing of the counters until the counters have decremented to zero, which corresponds to the last byte of the logical length of the field being transferred.

In accordance with the present invention, the computation of the logical length of the field to be transferred by the ADT 60 for data utilizing two-level ECC is performed by microprocessor 30. From the preceding count field, ADT 60 has stored the length, track address, and record location of the subsequent data field at suitable storage locations. At the termination of the field immediately preceding the data field to be transferred, i.e. at the beginning of the fixed time gap, microprocessor 30 fetches from the storage locations in ADT 60 the actual field length and the track and record number where the data is to be transferred to or from. The actual field length is then compared with a predetermined value, for example a value equal to the fixed subblock length (250) less the fixed number of second level ECC bytes (6). This value (244) is available to microprocessor 30 from ROM 34. If the actual field length is less than this value, microprocessor 30 then adds the fixed number of first and second level ECC bytes to the actual length, computes the number of bytes required to complete cell padding, and loads this new value into low and high counters 42, 40 respectively. At the termination of the fixed time gap, microprocessor 30 signals ADT 60 to commence data transfer and transfer commences simultaneously with the decrementing of low and high counters 42, 40. When the counters have decremented to zero a field equal to the actual field length increased by ECC bytes and padded cell bytes, has been transferred.

If, on the other hand, the actual length of the field to be transferred is greater than 244 bytes, microprocessor 30 loads early counter 44 with a fixed value, for example a value equal to the subblock length (250) plus the first level ECC bytes (6), and sets latch 50 to the early mode. This inhibits low and high counters 42, 40. Microprocessor 30 then begins the calculation to determine the total logical length of the field by computing the number of subblocks, the number of first level subblock ECC bytes and second level ECC bytes, as well as the number of bytes for cell padding. During this calculation, the fixed time gap may have elapsed and ADT 60 may be required to begin data transfer. If this occurs, then data transfer commences simultaneously with the decrementing of early counter 44 from its loaded value of 256. Thus data transfer commences while the computation of the total logical length continues within microprocessor 30. When microprocessor 30 has completed the calculation of the logical length, it then loads into low and high counters 42, 40 a value equal to the newly computed logical length less the fixed value of 256 loaded into early counter 44. When early counter 44 has decremented to zero, data transfer continues by the decrementing of low and high counters 42, 40. In this manner the data transfer commences without interruption, even though the calculation of the total logical length has required a time greater than the fixed time gap.

While the above description has been explained with reference to the calculation of the logical length required for two-level ECC and cell padding, microprocessor 30 is also required to perform defect skipping if the data field is to be written onto or read from a track containing a defect. The length and location of defects are obtained by reading the track number and record from storage locations stored within ADT 60 from the previous count field and then addressing a look-up table in ROM 34. The length and location of defects are used to determine which subblock is to be split into segments and the number of bytes to add to the field. For example, in FIG. 3C subblock 3 has been split across the 96 byte (3 cell) long defect.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A method for transferring data having variable length fields which are separated by fixed time gaps between a host processor and a data storage device wherein error correction bytes are encoded into or decoded from the data during transfer, the method comprising the steps of:
   determining the actual length of the field to be transferred;
   computing the number of error correction bytes for the field being transferred;
   initiating transfer of the field at the termination of the fixed time gap and before said computation has been completed if the determined actual field length is greater than a predetermined value; and completing transfer of the field when said computation has been completed.

2. The method according to claim 1 further comprising the steps of computing the number of padding bytes required for the field and computing the logical length of the field from the determined actual length, the computed error correction bytes and the computed padding bytes.

3. The method according to claim 1 wherein the step of initiating transfer of the field further comprises decrementing a count equal to a fixed value related to the predetermined value, and wherein the step of completing transfer of the field further comprises decrementing a count equal to the difference between the logical length of the field and the fixed value when the decremented count of the fixed value equals zero.

4. The method according to claim 1 wherein the error correction bytes are encoded and decoded at a subblock level and a field level, and wherein the step of computing the number of error correction bytes further comprises determining the number of subblocks within the field.

5. A method for transferring variable length data fields between a host processor and a disk file wherein two-level error correction is encoded into or decoded from the fields during transfer of the fields, the method comprising the steps of:
determining the actual length of the field to be transferred;
computing the number of subblocks within the field;
computing the number of error correction bytes required at the subblock and field levels;
initiating transfer of the field before computation of the number of required correction bytes is completed if the determined actual field length is greater than a predetermined value; and
completing transfer of the field when the error correction byte computation has been completed.

6. The method according to claim 5 wherein the step of initiating transfer of the field further comprises transferring initial bytes in the field while simultaneously counting down from a fixed value related to the predetermined value, and wherein the step of completing the transfer of the data field further comprises transferring remaining bytes in the field when the counting reaches zero.

7. The method according to claim 5 further comprising the steps of computing the number of padding bytes required for the field and summing the computed number of padding bytes, the number of error correction bytes and the actual length.

8. In an apparatus for the transfer of information of variable field length between a host processor and a data recording disk file wherein multiple-level error correction encoding and decoding of the fields into subblocks during transfer requires that the logical length of the fields be calculated during fixed time gaps between successive fields, an improvement comprising:
means coupled to the information transfer apparatus for reading the length of the field to be transferred at the end of the fixed time gap;
means for computing the number of subblocks in the field whose length has been read during the fixed time gap and for computing the logical length of the field required for error correction;
means for comparing the length of the field read with a predetermined value;
a first counter coupled to the computing means for receiving a fixed value related to the predetermined value from the computing means and for initiating transfer of the field before computation of the logical length has been completed by the computing means; and
a second counter coupled to the computing means for completing the transfer of the field when the first counting means has terminated the count of the fixed value.

9. The improvement according to claim 8 wherein at least some of the tracks in the disk file have defects preventing the writing or reading of data, the improvement further comprising:
memory storage means coupled to the computing means for storing values of the size and location of defects on a track onto which the subblocks of the field are to be written to or read from; and
wherein the computing means further comprises means responsive to the stored values for splitting the subblocks into segments, whereby the subblock segments may be written to or read from the tracks across the defects in the tracks, and means for calculating the logical length required for error correction of each subblock split into segments.

10. The improvement according to claim 8 wherein the information transfer apparatus is of the type wherein each field is padded to a discrete number of cells and wherein the computing means further comprises means for computing the logical length of the field required for both error correction and cell padding.

11. The improvement according to claim 8 wherein the second counter further comprises means for receiving from the computing means a value equal to the difference between the computed logical length and the fixed value.

* * * * *